United States Patent
Guillon

[19]

[11] Patent Number: 6,054,930
[45] Date of Patent: Apr. 25, 2000

[54] METER TAMPER DETECTION DEVICE CAPABLE OF COUNTING MULTIPLE OPENINGS

[75] Inventor: Jean-Louis Guillon, Migné-Auxances, France

[73] Assignee: Schlumberger Industries, S.A., Montrouge, France

[21] Appl. No.: 09/274,660

[22] Filed: Mar. 23, 1999

[30] Foreign Application Priority Data

Apr. 6, 1998 [FR] France ................................. 9804414

[51] Int. Cl.[7] .................................................. G08B 21/00
[52] U.S. Cl. ...................... 340/637; 340/545.6; 340/666; 340/542; 340/870.09; 340/870.02; 361/661; 361/664; 361/667; 324/74; 324/110
[58] Field of Search ................................. 340/545.6, 666, 340/542, 637, 870.09, 870.02; 361/661, 664, 667; 324/74, 110

[56] References Cited

U.S. PATENT DOCUMENTS

| | | | |
|---|---|---|---|
| 4,150,371 | 4/1979 | Scaglione | 340/568 |
| 4,583,483 | 4/1986 | Rausch | 116/204 |
| 5,017,877 | 5/1991 | Haus, Jr. | 324/546 |

*Primary Examiner*—Jeffery A. Hofsass
*Assistant Examiner*—Tai Tan Nguyen
*Attorney, Agent, or Firm*—Leonard W. Pojunas

[57] ABSTRACT

A device for detecting meter opening, the meter including at least a first structural element and a second structural element that are in a given position relative to each other when the meter is closed, said device comprising: a moving member connected to the first element and organized to take up a stable state or an unstable state as a function of the displacement of one of the structural elements relative to the other; holding means connected at least to the second element and co-operating with the moving member as a function of the displacement of one of the structural elements relative to the other, so as to hold said moving member in its unstable state and so as to enable it to go to its stable state; and detection means suitable for determining the state of the moving member and for emitting an opening signal when the moving member is in a predetermined state.

9 Claims, 3 Drawing Sheets

METER TAMPER DETECTION DEVICE CAPABLE OF COUNTING MULTIPLE OPENINGS

The present invention relates to a device for detecting that a meter has been opened, the meter including at least a first structural element and a second structural element in a given position relative to each other when the meter is closed. The invention also relates to a meter provided with such a device.

BACKGROUND OF THE INVENTION

Meters, such as electricity meters, are entrusted to users who might disassemble them in order to falsify them. That is why operators and manufacturers of meters equip them with devices making it possible to detect that a meter has been opened.

An old system consists in interconnecting the structural elements of the meter that move apart when the meter is opened with an authentication seal which breaks when the meter is opened. That technique makes it possible to detect that a meter has been opened only after the event, i.e. meter opening might be detected a long time after the event, and, in addition, such detection requires a human operator to intervene.

Document EP 0 490 710 describes another known technique for automatically detecting displacement of the structural elements of the meter on meter opening. The device described includes a remanence magnetic circuit made up of at least two portions, the position of one of the portions being dependent on the position of the first element, and the position of the other portion being dependent on the position of the second element, the magnetic circuit thus being closed when said elements are in an initial position, and being open when they are in any other position. The device further includes means for exciting the magnetic circuit while it is closed and in a determined magnetic state, and control means connected to the excitation means for the purpose of controlling said excitation means. Finally, that device includes detection means suitable for producing a displacement detection signal in response to a particular variation in the state of the magnetic circuit under the effect of the excitation means, the detection means advantageously including a single-pole detection circuit.

By applying a suitable sequence of magnetizing/demagnetizing operations to the magnetic circuit, that device makes it possible to detect displacement of the structural elements of the meter automatically, regardless of whether the displacement is temporary or not, automatic detection being possible even after the event and even if the device is temporarily deprived of electricity before, during, or after meter opening.

That type of device is high in cost (compared with the overall cost of the meter), even more so since the general trend in meter prices is downward.

Document EP 549 519 describes another type of meter opening detection device. A cam is connected to one of the screws of the cover and it is rotated when the screw is unscrewed. The cam then actuates a hammer which hits a piezoelectric plate. Under the effect of the impact, the piezoelectric plate emits an electrical pulse which is recorded in a memory.

Document FR 2 681 134 describes a device for opening the housing of a meter, the device comprising a washer secured to a screw for closing the cover onto the housing. A resistive track and a conductive track for detecting the angular position of the washer are provided. The angular position of the washer is stored, and a microprocessor compares the current position of the washer with the previously stored position. Any difference between the positions indicates that the screw has been moved.

Document EP 447 615 describes various devices also using detection of a change of position of a screw connecting the cover to the housing to deduce whether the meter has been opened (or an attempt has been made to open the meter).

OBJECTS AND SUMMARY OF THE INVENTION

The present invention provides a device for detecting meter opening, the meter including at least a first structural element and a second structural element that are in a given position relative to each other when the meter is closed, which device is low in cost (compared with the overall cost of the meter), while retaining the possibilities of automatically detecting meter opening even if the electrical power supply of the device is interrupted.

For this purpose, a device of the invention comprises:

a moving member connected to the first element and organized to take up a stable state or an unstable state as a function of the displacement of one of the structural elements relative to the other;

holding means connected at least to the second element and co-operating with the moving member as a function of the displacement of one of the structural elements relative to the other, so as to hold said moving member in its unstable state and so as to enable it to go to its stable state; and detection means suitable for determining the state of the moving member and for emitting an opening signal when the moving member is in a predetermined state.

In a variant embodiment, the holding means comprise a finger secured to the second element and co-operating with a catch connected to the first element.

Advantageously, the catch is mounted on a thin spring that bears against the finger when the meter is closed.

In another variant embodiment, the catch co-operates with a main spring that is secured to the first element, said main spring bearing against the finger when the meter is closed.

In a particular embodiment, the detection means comprise an electrical contact secured to the moving member, another electrical contact, with the two electrical contacts forming a switch, and a circuit for determining whether said switch is open or closed.

The moving member may be a blade co-operating with return means suitable for returning said blade to its stable position.

Alternatively, the moving member may be a piezoelectric blade, or else a thermoelectric blade.

Preferably, the device of the invention further comprises control means connected to the detection means for causing the moving member to return to one of its states, after an opening signal has been emitted by the detection means when the moving member has taken up the other state after one of the structural elements has been displaced relative to the other.

The present invention also relates to a meter including a device having at least one of the characteristics presented above.

BRIEF DESCRIPTION OF THE DRAWINGS

Other characteristics and advantages of the invention appear clearly from the following description given by way of non-limiting example and with reference to the accompanying drawings, in which.

MORE DETAILED DESCRIPTION

Figure 1:
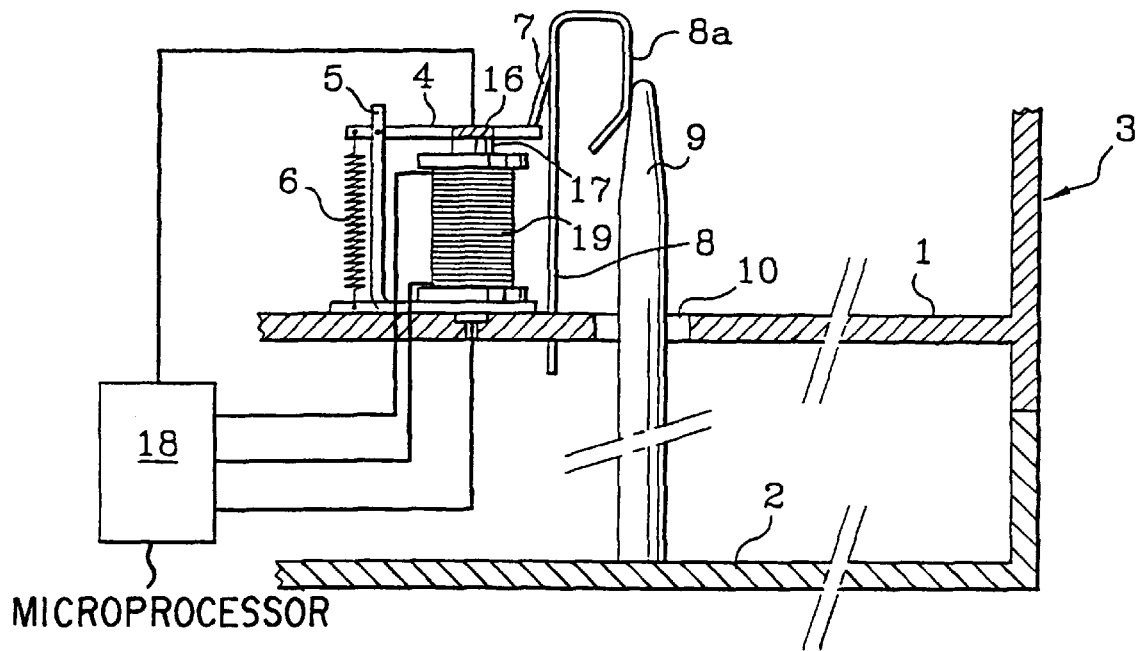
FIG. 1 is an overall diagram of a first variant embodiment of a device of the invention.

The device of the invention makes it possible to detect displacement, from an initial relative position, of two structural elements 1 and 2 of a meter 3 shown diagrammatically and in section in FIG. 1.

For this purpose, in general, and as explained in more detail in the description below, a mechanical memory having two states is maintained in a first state under normal operating conditions, and it is placed in a second state on meter opening. The second state is maintained even after the meter has been re-closed, and until meter opening has been detected and the mechanical memory has been re-initialized, i.e. returned to its initial state.

For example, the meter 3 is an electricity meter, shown in fragmentary manner, the element 1 being constituted by the housing of the meter, and the element 2 being a terminal cover designed to remain fixed to the housing under normal operating conditions. The invention thus makes it possible to detect opening of the terminal cover.

In the embodiment shown in FIG. 1, the device includes means 4, 5, 6 that are connected to the element 1 and that are part of the two-state mechanical memory. These means include a moving member 4 which is suitable for pivoting about an axis perpendicular to the plane of the figure, and which is fixed to a support 5. The moving member 4, which is a plate or a blade in this example, is suitable for pivoting between an unstable state, in which it is held in FIG. 1, and a stable state. The return means 6, constituted by a spring in this example, exert a force urging the moving member 4 into its stable position and holding it therein.

In FIG. 1, the meter is closed and operating normally. In which case, holding means 7, 8, 9 connected to the second element 2 co-operate with the moving member 4 in a manner such as to hold it in its unstable state. In the example shown, the holding means comprise a catch 7 secured to a spring-forming thin blade 8 fixed to the element 1 and having an end portion 8a in abutment against a finger 9 fixed to the second element 2. The finger 9 passes through the element 1 via an opening 10 provided for this purpose.

In this manner, the finger 9 holds the thin blade 8 in an extended condition, and the catch 7 bears against the plate 4 so as to hold it in the unstable position.

A description of how the device operates when the elements 1, 2 are displaced relative to each other is given below with reference to FIGS. 2, 3, and 4. Like reference numerals in the figures designate like elements.

Figure 2:
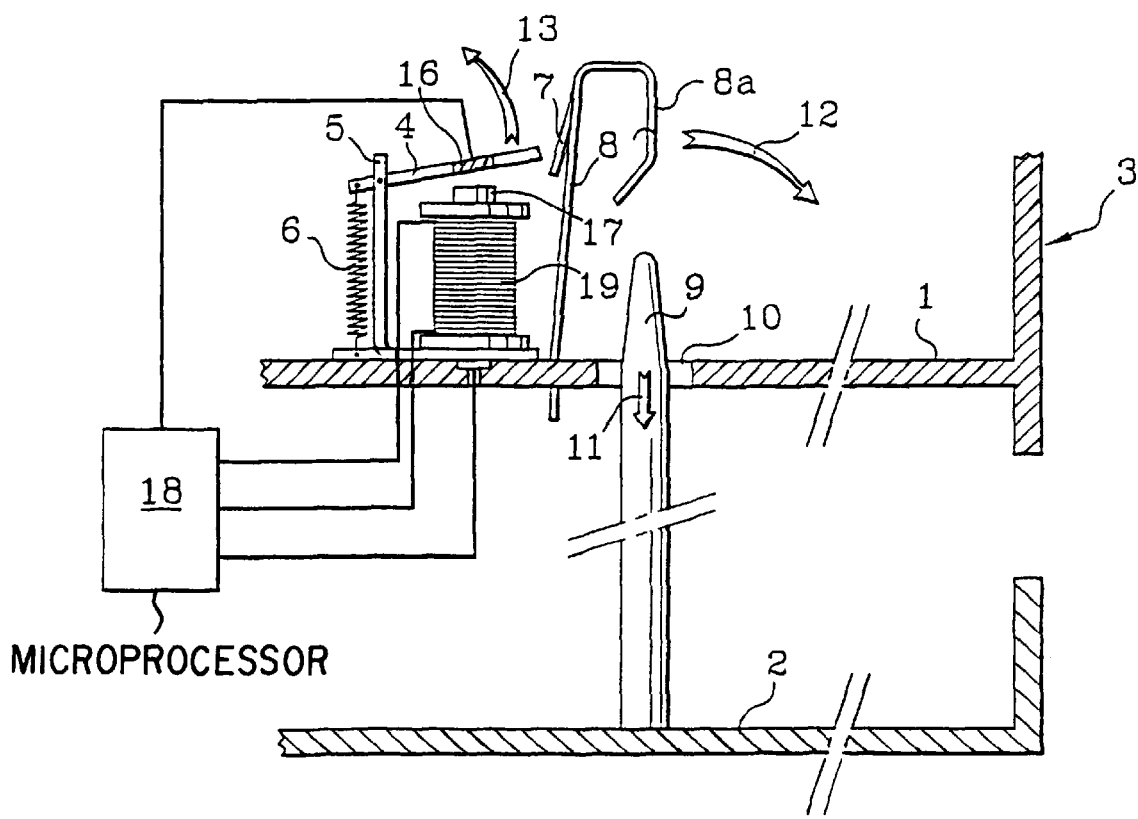
FIG. 2 is a diagram showing the FIG. 1 device on opening the meter.
Figure 3:
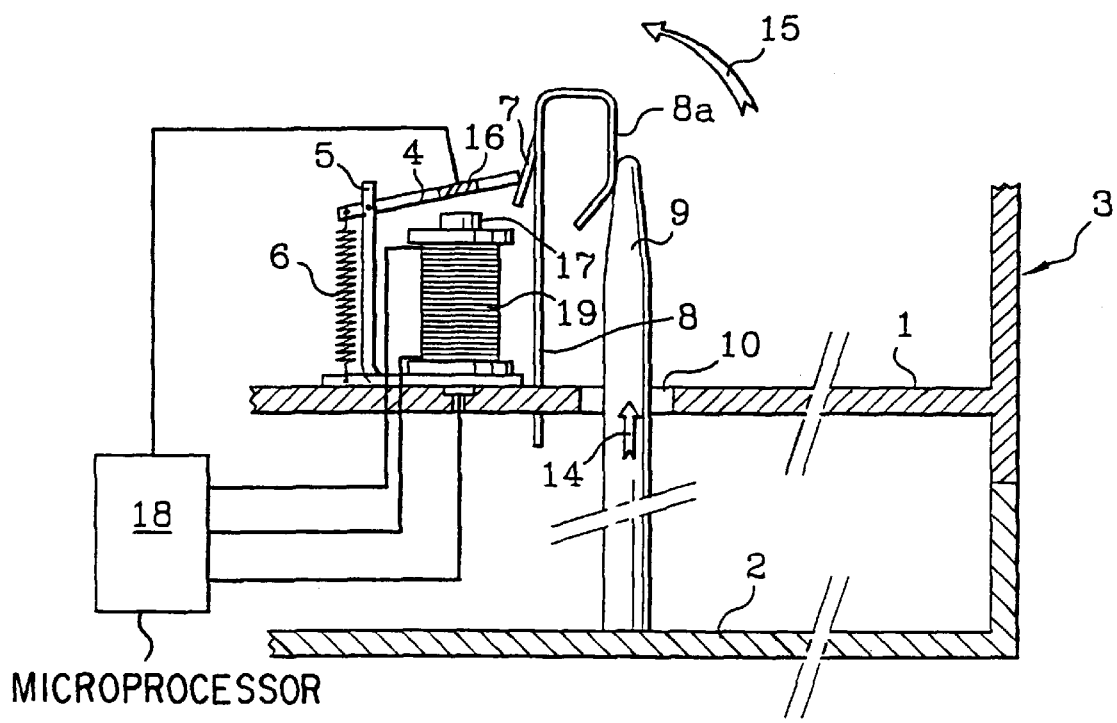
FIG. 3 is a diagram showing the FIG. 1 device on re-closing the meter.

FIG. 2 shows that displacing the second element 2, and thus opening the meter 3, causes the finger 9 to be withdrawn as indicated by arrow 11, thereby releasing the end 8a of the thin blade 8. The thin blade 8 thus takes up its rest position as indicated by arrow 12, entraining the catch which is secured to it. The withdrawal of the catch 7 releases the moving member 4 which, under the effect of the return force exerted by the spring 6, is returned to its stable state, as indicated by arrow 13.

Opening the meter thus causes the moving member 4 to change over from one state to the other. FIG. 3 diagrammatically shows the effects of closing the meter 3, and thus of putting the element 2 back in place.

The finger 9 penetrating through the opening 10, as indicated by arrow 14 comes into contact with the end 8a of the thin blade 8 which returns to its extension position, as indicated by arrow 15. However, the moving member 4 which is in its stable state is not re-engaged by the catch 7, and it retains its position.

Opening the meter 3, i.e. displacing the element 2 relative to its initial position, causes the position of the moving member 4 to change, whereas closing the meter 3, i.e. returning the element 2 to its initial position does not act on the position of the moving member 4.

Opening the meter 3 can thus be detected automatically, merely by detecting the change of state of the moving member 4, or, in equivalent manner, by determining the state in which the moving member 4 lies.

In the embodiment shown diagrammatically in FIGS. 1 to 4, means are provided for determining the state of the moving member 4, and they are constituted essentially by an electrical circuit that is closed under normal operating conditions, and open when the element 2 has been displaced. For this purpose, an electrical contact 16 is secured to the moving member 4. Another electrical contact 17 is provided so as to co-operate with the contact 16 to form a switch, said switch being closed when the moving member 4 is held in its unstable position and being open when the moving member 4 is in its stable state.

The contacts 16 and 17 are connected to a microprocessor 18 which tests periodically, e.g. every ten seconds, whether the switch formed by the contacts 16 and 17 is open or closed. If the microprocessor 18 detects that the switch is open, the moving member 4 is therefore in the stable position, which means that the meter 3 is open or has been opened.

The device operates even if the meter 3 is opened during an interruption in the electrical power supply to the meter. The moving member 4 changes over from one state to the other independently of any electrical energy input. Once the power supply is re-established, the microprocessor 18 automatically detects opening of the meter 3.

In a variant embodiment (not shown), the means for determining the state of the moving member may be optical means comprising a light source emitting a light beam towards a detector. In one of its states, the moving member interrupts propagation of the light beam, while, in the other of its states, it allows the beam to propagate freely. The microprocessor connected to the detector can thus determine the state of the moving member as a function of the signal emitted by the detector.

Once opening of the meter 3 has been detected, an opening signal is produced by the microprocessor 18, which signal makes it possible, for example, to increment a memory (not shown) in which successive openings are counted. The opening signal may also trigger a warning signal, cause a light-emitting diode (not shown) to be switched on, or cause an opening message to be displayed on a display (not shown) provided for this purpose.

Advantageously, the device of the invention includes control means connected to the detection means for the purpose of causing the moving member to return to its initial position, after an opening signal has been emitted by the detection means.

Figure 4:
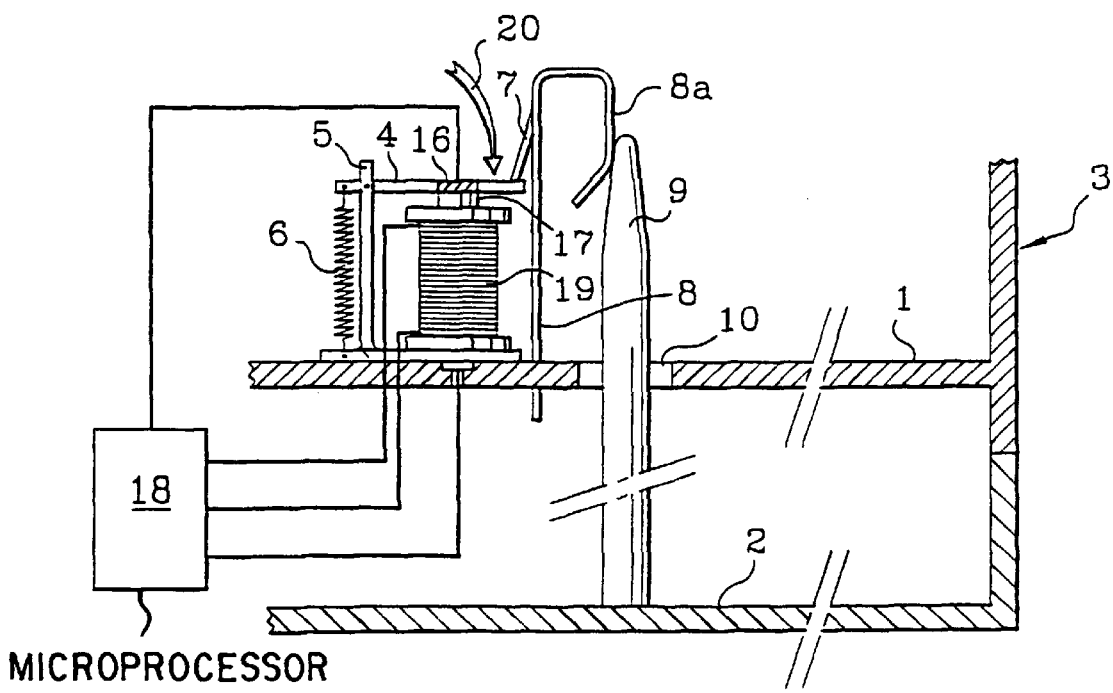
FIG. 4 is a diagram showing the FIG. 1 device after re-initialization.

As shown in FIG. 4, in this variant embodiment, the control means comprise a coil 19 connected to the microprocessor 18. In this case, the contact 17 is constituted by the end of a magnetic core plunging into the coil 19. Triggered by the opening signal, the microprocessor 18 emits an electrical pulse, e.g. having a duration of a few hundredths of a second, sufficient to create a magnetic field attracting the contact 16 and thus to return the moving member 4 to its initial position as indicated by arrow 20.

The catch 7 is then positioned in a manner such as to hold the moving member 4 in this position, even once the magnetic field has disappeared.

The device is thus re-initialized and ready to detect any subsequent opening of the meter 3.

Figure 5:
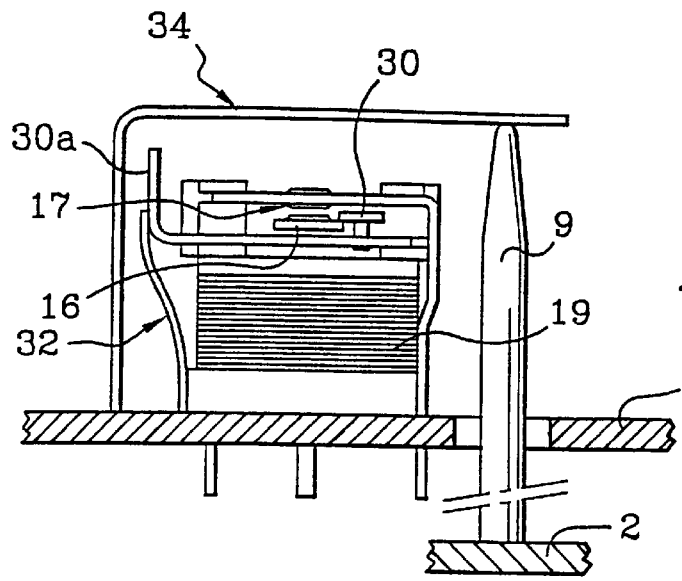
FIG. 5 is a diagram showing a second variant embodiment of a device of the invention.

FIG. 5 is a diagrammatic section view showing a variant embodiment of a device of the invention. Unlike the preceding variant, opening the meter causes the switch formed by the contacts 16 and 17 to close.

This variant offers the advantage of removing any risk of poor contact between the contacts 16, 17 under normal operating conditions, which would lead to opening of the meter being detected erroneously. Such poor contact can be caused by the catch not pressing the moving member 4 properly against the contact 17.

In the embodiment shown in FIG. 5, the catch 30 is secured to the coil 19. It is connected to a resilient blade 32 forming a return spring suitable for urging the catch 30 to move parallel to the plane of the figure. FIG. 5 shows the device under normal operating conditions, the blade 32 being in the rest position.

Under normal operating conditions, the catch 30 holds the moving member in its unstable state, only the contact 16 of the moving member being shown.

Displacing the finger 9 releases a spring-forming thin blade 34 which bears against the end 30a of the catch 30, thereby causing it to be withdrawn in translation, thereby releasing the contact 16.

The second contact 17 which co-operates with the contact 16 to form the switch is placed facing said contact 16 so that, when the catch 30 releases the moving member, the return means provided for this purpose but not shown in FIG. 5 press the contact 16 against the contact 17. The return means may, for example, be constituted by a spring as in the preceding variant.

The detection means which are, for example, identical to those described above (not shown) periodically test the state of the switch formed by the contacts 16 and 17, the closed state indicating meter opening. In which case, an opening signal is then emitted that has the same effects as those described above.

The embodiments shown in FIGS. 1 to 4 and 5 offer the advantage of being suitable for implementation using simple components such as relays which include the contacts necessary to form the switch, and return means, and they enable the device to be re-initialized by means of an electrical pulse.

Various other variants are possible for the device of the invention. For example, the return means 6 may be constituted by the moving member 4 being mounted resiliently on the support 5.

Figure 6:
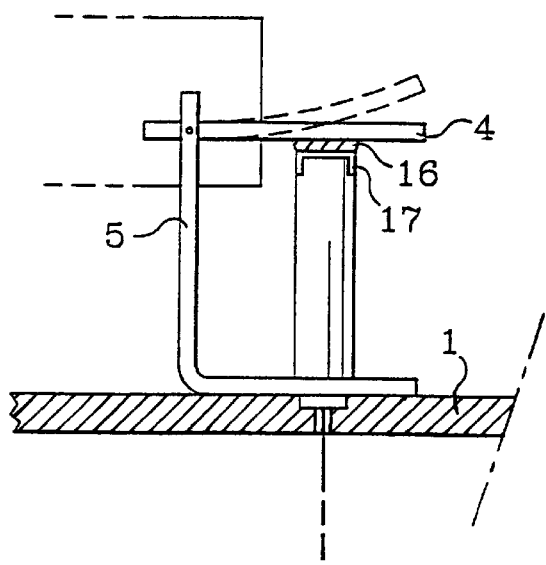
FIG. 6 is a fragmentary diagram showing another variant of a device of the invention.

In another variant embodiment shown in fragmentary manner in FIG. 6, the moving member 4 may be constituted by a piezoelectric thin blade enabling it to be returned to an unstable position and participating in the control means by replacing the coil 19. In equivalent manner, the thin blade may be made of a thermoelectric material. In which case, a winding placed around the blade makes it possible for it to be heated under the effect of an electrical pulse, thereby deforming it and causing it to go from one state to the other.

Figure 7:
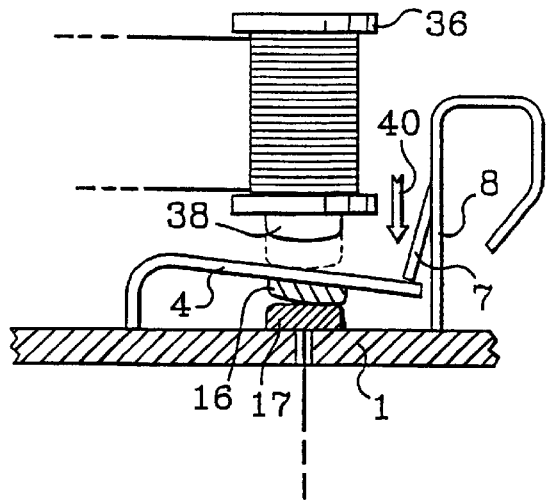
FIG. 7 is a fragmentary diagram showing another variant embodiment of a device of the invention.

FIG. 7 is a diagrammatic fragmentary view showing another variant embodiment of the device of the invention. A contact 16 is disposed on the moving member 4, which, in this example, is a spring-forming thin blade. The contact 17 secured to the element is placed facing the contact 16 so as to form a switch which is closed when the blade is held in the unstable position by the catch 17, and which is open otherwise.

Once the element 2 (not shown) has been displaced, the catch 7 releases the blade 4, thereby opening the switch. Once opening has been detected, once the number of openings has been incremented, and optionally once warning signals have been emitted, the control means re-initialize the device, the microprocessor (not shown in FIG. 7) transmits a suitable electrical signal to a coil 36 so that the plunger core 38 is displaced in the direction indicated by arrow 40 so as to return the moving member 4 to its unstable state.

Regardless of which variant is chosen, the device of the invention makes it possible to detect opening of a meter automatically, even if the electrical power supply to the device is momentarily interrupted, and to do so at low cost. In addition, such a device may be implemented with elements easily adapted from commercially available components.

I claim:

1. A device for detecting meter opening, the meter including at least a first structural element and a second structural element that are in a given position relative to each other when the meter is closed, said device comprising:

a moving member connected to the first element and organized to take up a stable state or an unstable state as a function of the displacement of one of the structural elements relative to the other;

holding means connected at least to the second element and co-operating with the moving member as a function of the displacement of one of the structural elements relative to the other, so as to hold said moving member in its unstable state and so as to enable it to go to its stable state;

detection means suitable for determining the state of the moving member and for emitting an opening signal when the moving member is in a predetermined state; and control means connected to the detection means for causing the moving member to return to one of its states, after an opening signal has been emitted by the detection means when the moving member has taken up the other state after one of the structural elements has been displaced relative to the other.

2. A device according to claim 1, wherein the holding means comprise a finger secured to the second element and co-operating with a catch connected to the first element.

3. A device according to claim 2, wherein the catch is mounted on a thin spring that bears against the finger when the meter is closed.

4. A device according to claim 2, wherein the catch co-operates with a main spring that is secured to the first element, said main spring bearing against the finger when the meter is closed.

5. A device according to claim 1, wherein the detection means comprise an electrical contact secured to the moving member, another electrical contact, with the two electrical contacts forming a switch, and a circuit for determining whether said switch is open or closed.

6. A device according to claim 1, wherein the moving member is a blade co-operating with return means suitable for returning said blade to its stable position.

7. A device according to claim 1, wherein the moving member is a piezoelectric blade.

8. A device according to claim 1, wherein the moving member is a thermoelectric blade.

9. A meter including a device according to claim 1.

\* \* \* \* \*